United States Patent
Yang et al.

[11] Patent Number: 5,854,130
[45] Date of Patent: Dec. 29, 1998

[54] METHOD OF FORMING MULTILEVEL INTERCONNECTS IN SEMICONDUCTOR DEVICES

[75] Inventors: Fu-Liang Yang, Tai Nan; Yin Chen, Hsinchu, both of Taiwan

[73] Assignee: Vanguard International Semiconductor Corp., Taiwan

[21] Appl. No.: 864,073

[22] Filed: May 28, 1997

[30] Foreign Application Priority Data

Nov. 20, 1996 [TW] Taiwan ................................. 85114292

[51] Int. Cl.[6] .............................................. H01L 21/4763
[52] U.S. Cl. .......................... 438/637; 438/633; 438/631; 438/645
[58] Field of Search ..................... 438/622, 626, 438/631, 633, 637, 645

[56] References Cited

U.S. PATENT DOCUMENTS 5,721,155  8/1995  Lee .......................................... 437/195

*Primary Examiner*—John Niebling
*Assistant Examiner*—David A Zarneke
*Attorney, Agent, or Firm*—Finnegan, Henderson, Farabow, Garrett & Dunner, L.L.P.

[57] ABSTRACT

A method for forming multilevel interconnects in a semiconductor IC device is provided. The method involves a simplified planarization process for planarization of intermetal dielectrics that allows for easy and cost-effective fabrication of the device. By this method, an insulating layer is formed over a substrate, then a first conductive layer is formed over the insulating layer and which is selectively removed to form conductive interconnects. Subsequently, a dielectric layer is formed over the conductive interconnects. A photoresist layer is then formed and patterned over the dielectric layer by a spin-coating process. An etching process is then conducted on the photoresist layer and the dielectric layer with a 1:1 etching ratio until the photoresist layer is completely removed. At the same moment when the photoresist layer is completely removed, the via holes are formed. The following steps are the same for fabricating the next-level interconnects. In the foregoing method, the spin-coating process allows the photoresist layer to be formed with a flat top surface. In the etching process, the 1:1 etching ratio on the photoresist layer and the dielectric layer allows the underlying dielectric layer to have a flat top surface when the photoresist layer is completely removed. The planarization process is significantly simplified. This allows the manufacturing costs to be significantly reduced.

7 Claims, 7 Drawing Sheets

METHOD OF FORMING MULTILEVEL INTERCONNECTS IN SEMICONDUCTOR DEVICES

BACKGROUND OF THE INVENTION

1. Field of the Invention

This invention relates in general to methods of forming multilevel interconnects in semiconductor integrated circuit (IC) devices, and more particularly, to a method of forming multilevel interconnects in a semiconductor IC device with a simplified planarazation process for planarization of inter-metal dielectrics.

2. Description of Related Art

When the integration for a semiconductor IC device, such as MOS (metal-oxide semiconductor) ICs, is increased to a large level that no longer allow the surface of the wafer to accommodate all the required interconnects, multilevel interconnects are formed in the wafer as a solution. Each level of interconnects is separated from the other by inter-metal dielectrics. One key process in the fabrication of these inter-metal dielectric layers is the so-called planarization process which is used to form the dielectric layers with a very flat top surface.

In conventional methods for forming multilevel interconnects, the planarization process is achieved by using the spin-on-glass (SOG) technique and the chemical mechanical polishing (CMP) technique. FIGS. 1 through 11 are schematic sectional diagrams used to depict the steps involved in a conventional method for forming multilevel interconnects in a semiconductor device.

Referring first to FIG. 1, in the first step, an insulating layer 11 is formed over a semiconductor wafer. Then, a conductive layer 12 is formed over the insulating layer 11.

Referring next to FIGS. 2 and 3, there are shown the steps for pattern definition of the conductive layer 12. First, a photoresist layer 13 covering selected portions of the underlying conductive layer 12 is formed over the wafer. Using the photoresist layer 13 as a mask, the exposed portions of the conductive layer 12 are etched away. After removing the photoresist layer 13, the underlying portions of the conductive layers 12 that were originally covered by the photoresist layer 13 are exposed, which serve as a plurality of first-level interconnects 15 for the device.

Referring further to FIGS. 4 through 7, there are shown the steps to form a planarized dielectric layer prior to the forming of the second-level interconnects. As shown in FIG. 4, a first dielectric layer 16 is deposited over the wafer of FIG. 3, and then, as shown in FIG. 5, a second dielectric layer 17 is formed by the SOG method over the first dielectric layer 16. Through the SOG process, the second dielectric layer 17 is able to fill up the trenches in the first dielectric layer 16 and to be formed with a planarized top surface. Thereafter, the second dielectric layer 17 is etched back by applying an etchant 18 thereon until the topmost surfaces of the first dielectric layer 16 are exposed, as illustrated in FIG. 6. Subsequently, as shown in FIG. 7, a third dielectric layer 18 is deposited over the second dielectric layer 17. This completes the forming of a sandwich-type structure of dielectric layers in the wafer.

Referring further to FIGS. 8 through 10, there are shown the steps to form via plugs for interconnecting the first-level interconnects 15 to their upper level interconnects that are to be formed later. First, as shown in FIG. 8, a photoresist layer 19 covering selected areas on the wafer is formed. The areas uncovered by the photoresist layer 19 are the locations where the via plugs are to be formed. Subsequently, an etching process is conducted on the wafer by applying an etchant 20 on the wafer. Using the photoresist layer 19 as a mask, the etchant 20 etches away in successive order the unmasked parts of the third dielectric layer 18 and the first dielectric layer 16 (sometimes including parts of the second dielectric layer 17) until the top surfaces of the first-level interconnects 15 are exposed, as illustrated in FIG. 9, thus forming via holes 21. The photoresist layer 19 is then removed. Further, as shown in FIG. 10, a conductive material is filled into the via holes 21 either by depositing a conductive layer which is then selectively removed, or by selective deposition, so as to form the desired via plugs 22.

Referring finally to FIG. 11, a conductive layer 23 is deposited over the entire wafer. Repeating the steps described in FIG. 1 through FIG. 10, the conductive layer 23 can be selectively removed to form the next-level interconnects for the device.

One drawback to the foregoing method is that the planarization process is quite complex and thus time-consuming to carry out. In addition, the SOG method can easily cause the production of particles, delamination, and outgassing. One solution to this problem is to deposit thicker dielectric layers and then use CMP technique for planarization of the dielectric layers. However, this solution is very costly to carry out.

SUMMARY OF THE INVENTION

It is therefore a primary objective of the present invention to provide a method for forming multilevel interconnects in a semiconductor IC device, which involved a simplified planarization process that allows for easy and cost-effective fabrication of the IC devices.

In accordance with the foregoing and other objectives of the present invention, a new method for forming multilevel interconnects in a semiconductor IC device is provided. The method includes a first step of preparing a substrate, and then forming an insulating layer over the substrate; a second step of forming a first conductive layer over the insulating layer; a third step of selectively removing part of the first conductive layer to form a plurality of conductive interconnects; a fourth step of forming a dielectric layer over the conductive interconnects; a fifth step of forming a photoresist layer over the dielectric layer, the areas uncovered by the photoresist layer being the locations where a plurality of via holes are to be formed; a sixth step of using the photoresist layer as a mask to conduct an etching process on the photoresist layer and the dielectric layer until the photoresist layer is completely removed, the etched portions of the dielectric layer being the via holes; a seventh step of depositing a second conductive layer in the via holes to form a plurality of via plugs; and finally an eighth step of forming a third conductive layer over the wafer.

In the foregoing method, the photoresist layer is formed by a spin-coating process such that the top surface thereof is flat. In the etching process, the 1:1 etching ratio on the photoresist layer and the dielectric layer allows the underlying dielectric layer to have a flat top surface when the photoresist layer is completely removed. By this method, the semi-conductor structures such as the SOG layer and the complex sandwich-type structure of dielectric layers utilized in the prior art are eliminated. Thus, the invention allows a simplified planarization process for planarization of dielectric layers.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

FIGS. 12 through 19 are schematic sectional diagrams used to depict the steps involved in a method according to the present invention for forming multilevel interconnects in a semiconductor IC device.

Figure 1:
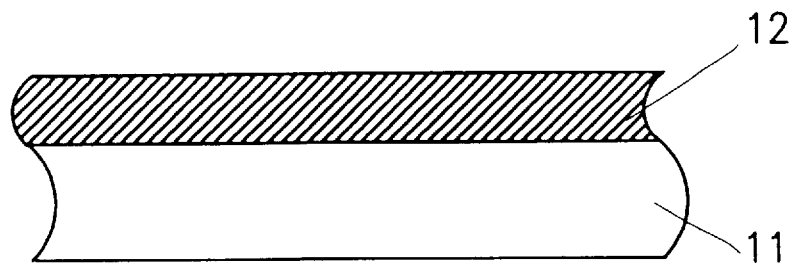
FIGS. 1 through 11 are schematic sectional diagrams used to depict the steps involved in a conventional method for forming multilevel interconnects in a semiconductor IC device.
Figure 2:
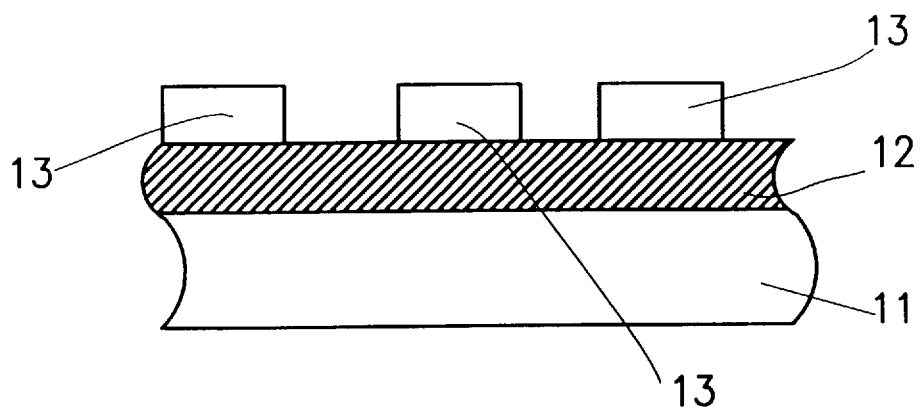
Figure 3:
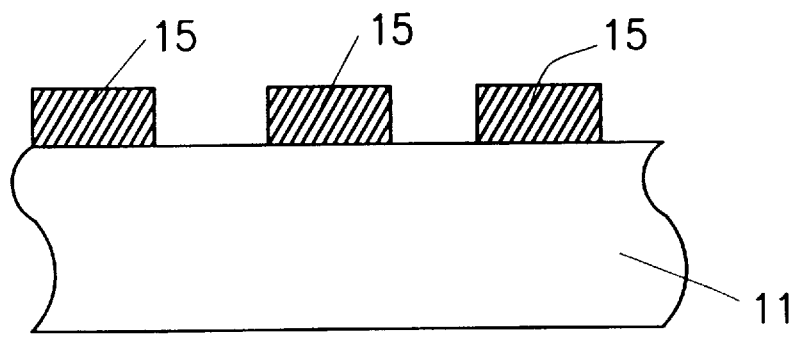
Figure 4:
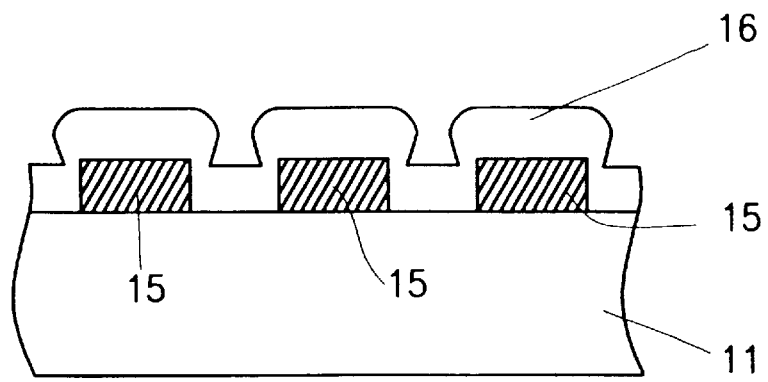
Figure 5:
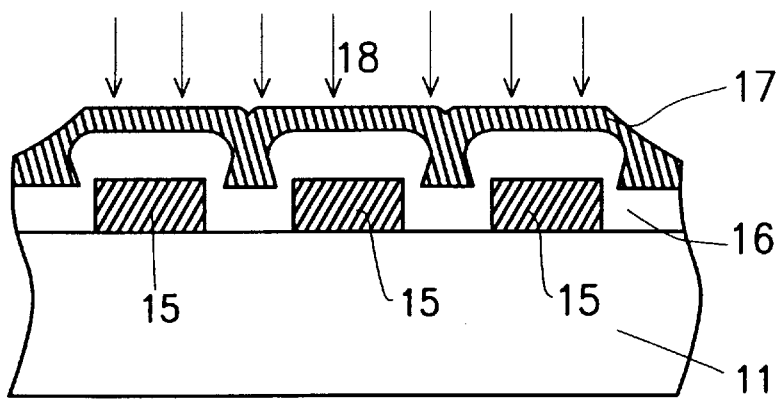
Figure 6:
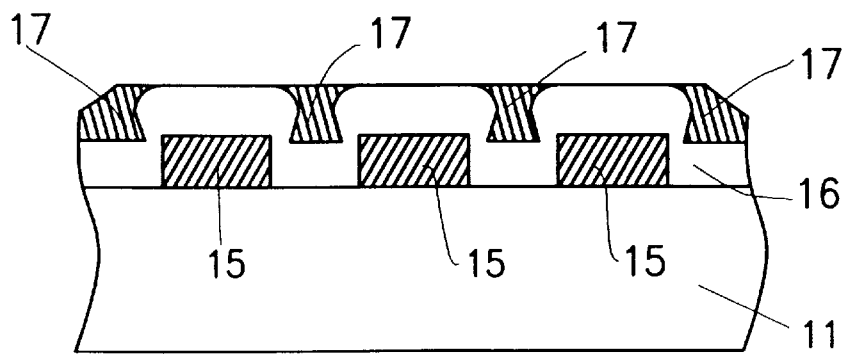
Figure 7:
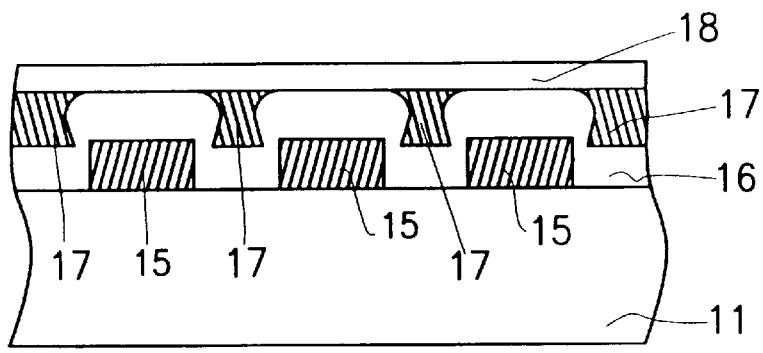
Figure 8:
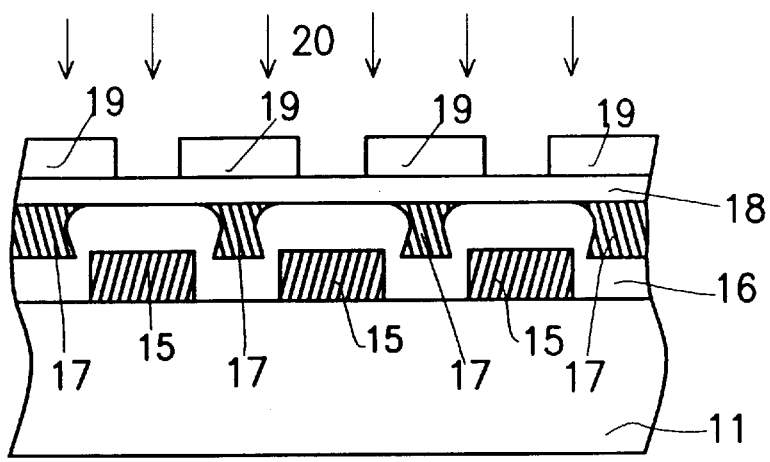
Figure 9:
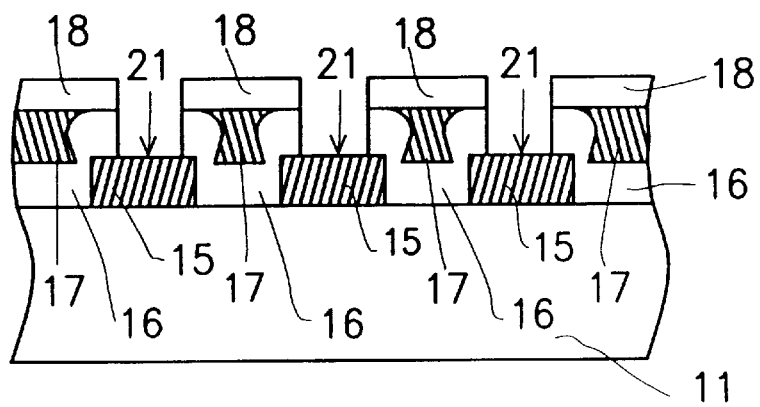
Figure 10:
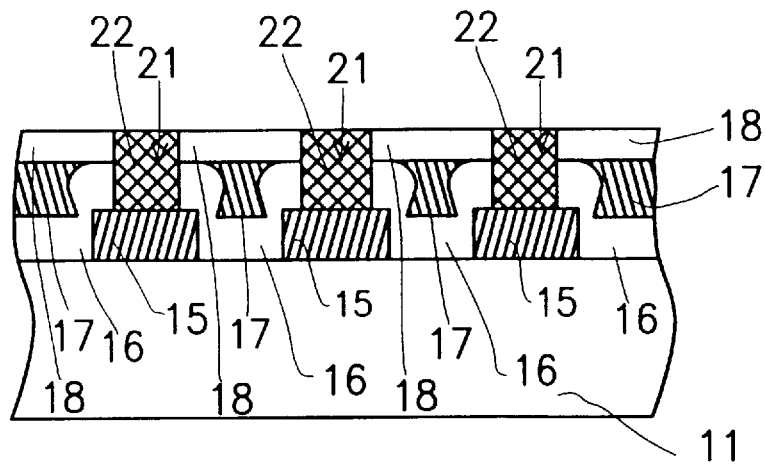
Figure 11:
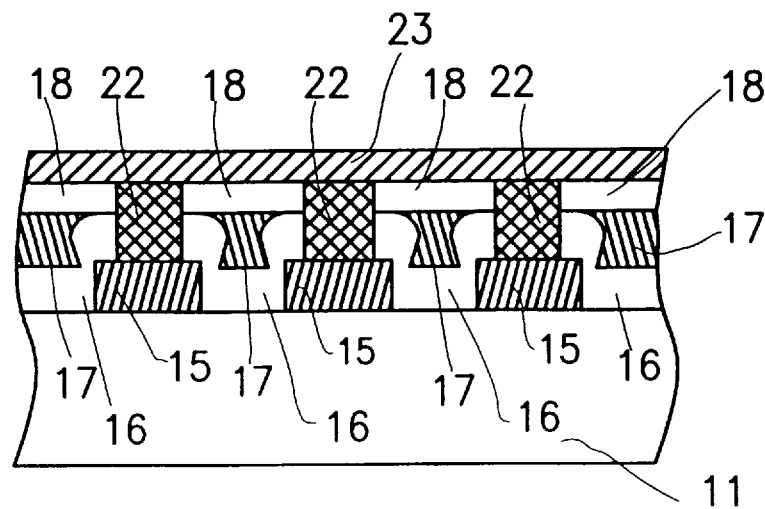
Figure 12:
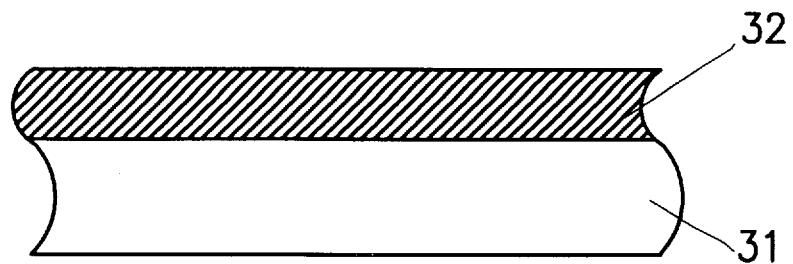
FIGS. 12 through 19 are schematic sectional diagrams used to depict the steps involved in a method according to the present invention for forming multilevel interconnects in a semiconductor IC device.
Figure 13:
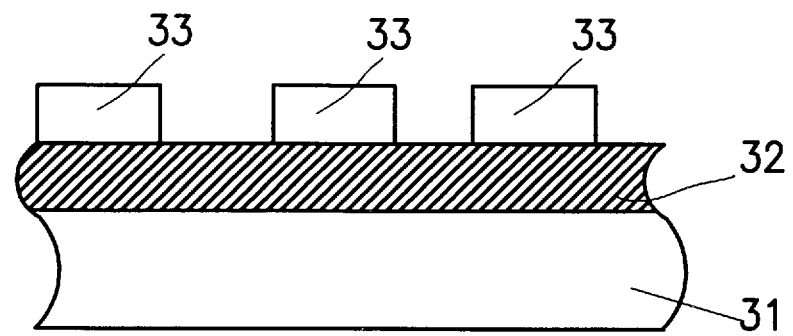
Figure 14:
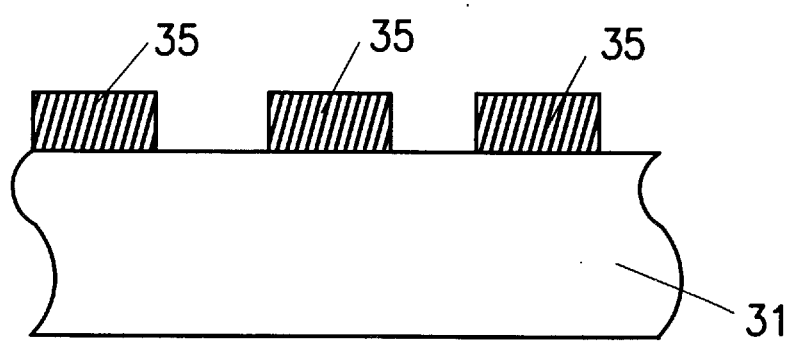

Referring first to FIGS. 12 through 14, there are shown the steps to form the first-level interconnects. First, as shown in FIG. 12, an insulating layer 31, such as an oxide layer, is formed over a semiconductor wafer, and then a first conductive layer 32, such as aluminum, is formed over the insulating layer 31. Then, as shown in FIG. 13, a photoresist layer 33 is formed over the first conductive layer 32. The portions of the first conductive layer 32 that are covered by the photoresist layer 33 are to be defined as the first-level interconnects for the device. Using the photoresist layer 33 as a mask, an etching process is conducted on the wafer so as to remove the exposed portions of the first conductive layer 32. After removing the photoresist layer 13, a plurality of first-level interconnects 35 are formed, as illustrated in FIG. 14.

Figure 15:
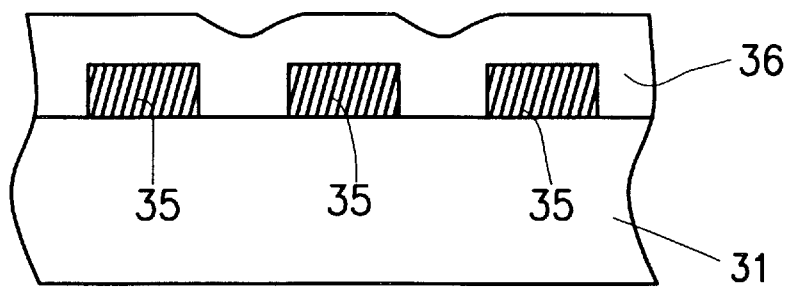
Figure 16:
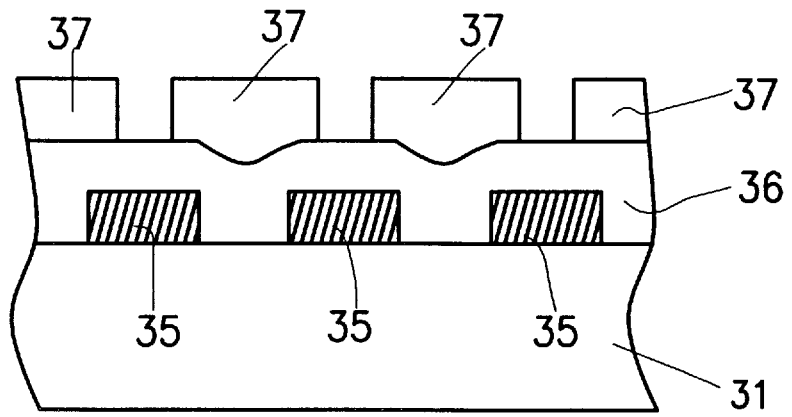
Figure 17:
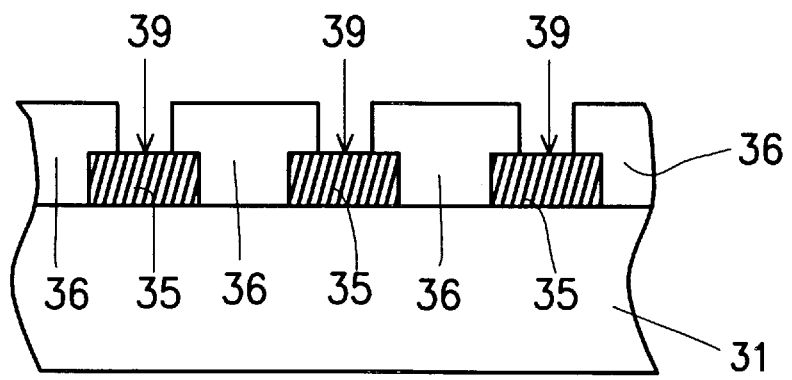

Referring further to FIGS. 15 through 17, there are shown the steps to form dielectric layers and via holes. First, as shown in FIG. 15, a dielectric layer 36, such as silicon oxide, is deposited over the entire wafer to a thickness of about 7,000 Å to 15,000 Å. Since the first-level interconnects 35 causes a jagged surface to the wafer, the overlaying dielectric layer 36 correspondingly has a jagged top surface, as illustrated in FIG. 15. A photoresist layer 37 is then formed over the dielectric layer 36 by using the spin-coating process which allows the photoresist layer 37 to be formed with a flat top surface. The photoresist layer 37 is selectively removed by a conventional photolithographic and etching process. The areas uncovered by the remaining photoresist layer 37 are the locations where a plurality of via holes are to be formed. Subsequently, an etching process is conducted on the wafer to etch both of the photoresist layer 37 and the dielectric layer 36 with a 1:1 etching ratio. This etching process is precisely controlled in such a manner that, at the moment the photoresist layer 37 is completed removed, the via holes 39 are also formed. Those portions of the dielectric layer 36 that were originally covered by the photoresist layer 37 are now partly etched away to obtain a flat surface, as illustrated in FIG. 17.

Figure 18:
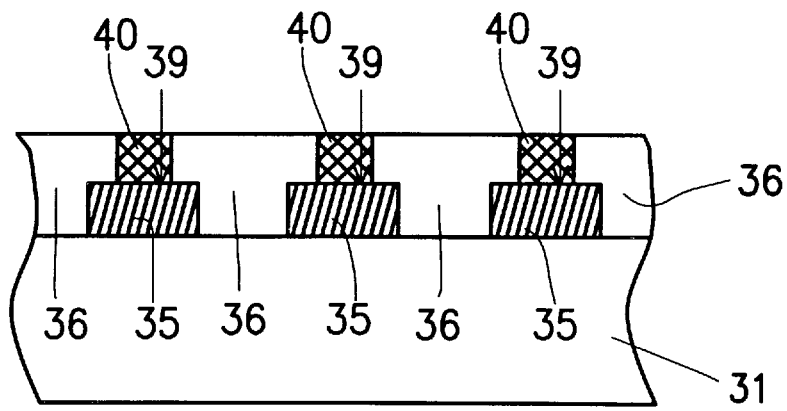
Figure 19:
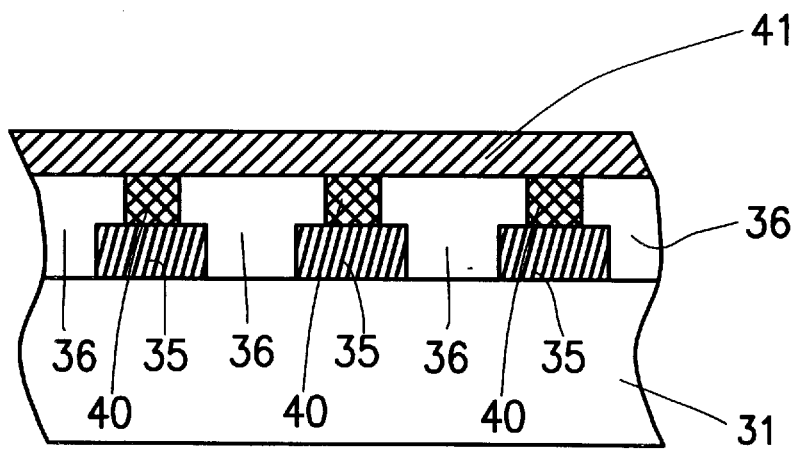

Referring further to FIGS. 18 and 19, there are shown the steps to form the second-level interconnects. First, as shown in FIG. 18, a conductive material, such as tungsten, is filled into the via holes 39 to form a plug 40 in each of the via holes 39. These plugs 40 can be formed either by depositing a conductive layer which is then selectively removed to form the desired plugs, or by selective deposition. A conductive layer 41, such as aluminum, is then deposited over the entire wafer. Repeating the steps described in FIG. 12 through FIG. 18, the conductive layer 41 is formed into the second-level interconnects.

By the invention, the inter-metal dielectric layers are planarized along with the forming of the via holes. The SOG layer and the complex sandwich-type structure of dielectric layers that are utilized in the prior art are here eliminated. Therefore, the invention allows a simplified planarization process for planarization of the dielectric layer 36. Manufacturing costs can thus be significantly reduced.

The invention has been described using exemplary preferred embodiments. However, it is to be understood that the scope of the invention is not limited to the disclosed embodiments. To the contrary, it is intended to cover various modifications and similar arrangements. The scope of the claims, therefore, should be accorded the broadest interpretation so as to encompass all such modifications and similar arrangements.

What is claimed is:

1. A method for forming multilevel interconnects in a semiconductor IC device, comprising the steps of:

(1) preparing a substrate, and then forming an insulating layer over the substrate;

(2) forming a first conductive layer over the insulating layer;

(3) selectively removing part of the first conductive layer so as to form a plurality of conductive interconnects;

(4) forming a dielectric layer over the conductive interconnects;

(5) forming a photoresist layer over the dielectric layer, the areas uncovered by the photoresist layer being the locations where a plurality of via holes are to be formed;

(6) conducting an etching process on the photoresist layer and the dielectric layer until the photoresist layer is completely removed, the removed portions of the dielectric layer forming the via holes;

(7) depositing a second conductive layer in the via holes to form a plurality of via plugs; and (8) forming a third conductive layer over the wafer.

2. The method of claim 1, wherein in said step (5) the photoresist layer is formed by a spin coating process.

3. The method of claim 1, wherein in said step (6) the etching process is conducted on the photoresist layer and the dielectric layer with a 1:1 etching ratio.

4. The method of claim 1, wherein the first conductive layer is a layer of aluminum.

5. The method of claim 1, wherein the second conductive layer is a layer of tungsten.

6. The method of claim 1, wherein the dielectric layer is a layer of silicon oxide deposited to a thickness of about 7,000 Å to 5,000 Å.

7. The method of claim 1, wherein the third conductive layer is a layer of aluminum.

\* \* \* \* \*